(12) United States Patent
Itani

(10) Patent No.: US 9,743,567 B2
(45) Date of Patent: Aug. 22, 2017

(54) ELECTROMAGNETIC SHIELDING COMPONENT AND ELECTRIC WIRE ASSEMBLY WITH ELECTROMAGNETIC SHIELDING COMPONENT

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

(72) Inventor: Yasushi Itani, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/116,906

(22) PCT Filed: Jan. 20, 2015

(86) PCT No.: PCT/JP2015/051350
§ 371 (c)(1),
(2) Date: Aug. 5, 2016

(87) PCT Pub. No.: WO2015/118937
PCT Pub. Date: Aug. 13, 2015

(65) Prior Publication Data
US 2017/0181337 A1    Jun. 22, 2017

(30) Foreign Application Priority Data
Feb. 6, 2014   (JP) .................. 2014-021146

(51) Int. Cl.
*H05K 9/00* (2006.01)
*H01R 13/6592* (2011.01)
*H02G 3/04* (2006.01)

(52) U.S. Cl.
CPC ....... *H05K 9/0098* (2013.01); *H01R 13/6592* (2013.01); *H02G 3/0462* (2013.01); *H05K 9/0018* (2013.01)

(58) Field of Classification Search
CPC .................................................. H05K 9/0098
See application file for complete search history.

(56) References Cited

U.S. PATENT DOCUMENTS

| 6,545,220 B2* | 4/2003 | Syed .................... H02G 3/0481 |
| | | 174/75 C |
| 7,692,096 B2* | 4/2010 | Gladd ............... B29C 45/14426 |
| | | 174/75 C |

(Continued)

FOREIGN PATENT DOCUMENTS

| JP | 11260175 | 9/1999 |
| JP | 2006310127 A | 11/2006 |

(Continued)

OTHER PUBLICATIONS

International Search Report and Written Opinion for Application No. PCT/JP2015/051350 Dated Mar. 17, 2015, 7 pages.

(Continued)

*Primary Examiner* — Hung V Ngo
(74) *Attorney, Agent, or Firm* — Reising Ethington P.C.

(57) ABSTRACT

An object is to prevent electric wires from being brought into contact with, and being damaged by, an edge of a rigid pipe of an electromagnetic shielding component, without need for an additional component such as a cover for an end portion of the pipe, despite the increased density of the electric wires within a hollow space in the pipe. A shielding pipe includes an expanded-diameter portion that is an end (Continued)

portion whose inner and outer circumferential surfaces each have a diameter that is greater than diameters of inner and outer circumferential surfaces of a portion that is contiguous with the expanded-diameter portion. A ring-shaped coupling member holds an overlapping portion of a flexible shielding member, the overlapping portion being sandwiched between the coupling member and the inner circumferential surface of the shielding pipe. The overlapping portion overlaps the inner circumferential surface of the expanded-diameter portion.

5 Claims, 4 Drawing Sheets

(56) References Cited

U.S. PATENT DOCUMENTS

| | | | | |
|---|---|---|---|---|
| 8,895,875 | B2* | 11/2014 | Kato | H02G 3/0462 |
| | | | | 174/359 |
| 9,083,162 | B2* | 7/2015 | Adachi | B60R 16/0207 |
| 9,161,482 | B2* | 10/2015 | Adachi | H01R 13/648 |
| 9,272,675 | B2* | 3/2016 | Toyama | B60R 16/0215 |
| 9,349,506 | B2* | 5/2016 | Toyama | B60R 16/0215 |
| 9,504,193 | B2* | 11/2016 | Ford | H05K 9/0009 |
| 9,550,461 | B2* | 1/2017 | Nakai | H02G 3/0481 |
| 2010/0126752 | A1* | 5/2010 | Watanabe | H05K 9/0098 |
| | | | | 174/102 D |
| 2013/0306346 | A1* | 11/2013 | Izawa | H02G 3/0468 |
| | | | | 174/102 R |
| 2014/0251681 | A1 | 9/2014 | Adachi | |
| 2016/0100509 | A1* | 4/2016 | Yanagihara | H01R 9/034 |
| | | | | 174/350 |

FOREIGN PATENT DOCUMENTS

| | | | |
|---|---|---|---|
| JP | 2006310516 A | 11/2006 |
| JP | 2006311699 A | 11/2006 |
| JP | 2007280814 A | 10/2007 |
| JP | 2008071645 A | 3/2008 |
| JP | 2008226530 A | 9/2008 |
| JP | 2013114785 A | 6/2013 |

OTHER PUBLICATIONS

English Translation of International Search Report for Application No. PCT/JP2015/051350 Dated Mar. 17, 2015, 2 pages.

International Preliminary Report on Patentability for Application No. PCT/JP2015/051350 Dated Jan. 20, 2015, 4 pages.

\* cited by examiner

ELECTROMAGNETIC SHIELDING COMPONENT AND ELECTRIC WIRE ASSEMBLY WITH ELECTROMAGNETIC SHIELDING COMPONENT

CROSS REFERENCE TO RELATED APPLICATIONS

This application claims the priority of Japanese patent application JP2014-021146 filed on Feb. 6, 2014, the entire contents of which are incorporated herein.

TECHNICAL FIELD

The present invention relates to an electromagnetic shielding component that includes a rigid shielding pipe and a flexible shielding member, and to an electric wire assembly with the electromagnetic shielding component.

BACKGROUND ART

In some cases, an electromagnetic shielding component that encloses electric wires is adopted in a wire harness that is installed in a vehicle such as an automobile. The electromagnetic shielding component may include a rigid metal pipe and a tubular braided wire that is coupled to the metal pipe.

The metal pipe of the electromagnetic shielding component has an electromagnetic shielding function, and also physically protects the electric wires and maintains the electric wires in a shape that extends along a predetermined wiring route.

The braided wire is a tubular member that is formed by braiding copper wires, and is therefore flexible. The flexible braided wire has an electromagnetic shielding function, and allows a portion in an end region of the electric wires to be bent.

As disclosed in Patent Document 1 (JP 2007-280814A), the metal pipe and the braided wire are usually coupled to each other using a crimp ring. If this is the case, the crimp ring squeezes the metal pipe from the outer circumferential surface of the metal pipe, and a portion of the braided wire that covers the outer circumferential surface of a portion in an end region of the metal pipe is sandwiched between the crimp ring and the metal pipe. As a result, a portion in an end region of the braided wire is held on the outer circumferential surface of the portion in the end region of the metal pipe.

In a shielded conductive path disclosed in Patent Document 2 (JP 2006-310127A), a braided wire is sandwiched between the outer circumferential surface of a supporting member that is inserted into a metal pipe, and the inner circumferential surface of a crimped portion (a compressed portion) of the metal pipe. As a result, a portion in an end region of the braided wire is held on the inner circumferential surface of a portion in an end region of the metal pipe.

SUMMARY OF INVENTION

In a conventional and typical electromagnetic shielding component, an end face of the metal pipe is located inside the braided wire. If this is the case, there is a concern that electric wires passing through a hollow space in the metal pipe are brought into contact with an edge of the end face of the metal pipe, and are damaged.

In light of this concern, a typical electromagnetic shielding component is provided with an edge cover that covers an end portion of the metal pipe. However, in recent years, in order to meet a demand for reducing labor hours required for inventory management, there has been a demand for preventing the electric wires from being damaged, without using an edge cover.

In the shielded conductive path disclosed in Patent Document 2, the braided wire is interposed between the electric wires and an end portion of the metal pipe, and the electric wires are thus prevented from being damaged. Therefore, an edge cover is not required.

In the shielded conductive path disclosed in Patent Document 2, a sufficiently wide gap into which the supporting member holding the braided wire can be inserted is required between the inner circumferential surface of the metal pipe and the outer circumferential surface of the bunch of electric wires.

However, when it is required that a thinner metal pipe be adopted, it is necessary to increase the density of the electric wires within the hollow space in the metal pipe, and it is thus difficult to provide a sufficiently wide gap inside the metal pipe into which the supporting member can be inserted.

An object of the present design is to prevent electric wires from being brought into contact with, and being damaged by, an edge of a rigid pipe of an electromagnetic shielding component, without need for an additional component such as a cover for an end portion of the pipe, despite the increased density of the electric wires within a hollow space provided in the pipe.

An electromagnetic shielding component according to a first aspect includes a shielding pipe, a flexible shielding member, a coupling member, and a grommet.

(1) The shielding pipe is a rigid tubular member that contains metal material. The shielding pipe includes an expanded-diameter portion that is an end portion whose inner circumferential surface and outer circumferential surface each have a diameter that is greater than diameters of an inner circumferential surface and an outer circumferential surface of a portion that is contiguous with the expanded-diameter portion.

(2) The flexible shielding member is a flexible tubular member that contains metal material. A portion in an end region of the flexible shielding member constitutes an overlapping portion that overlaps the inner circumferential surface of the expanded-diameter portion of the shielding pipe. The flexible shielding member is configured to provide a continuous hollow space together with the shielding pipe.

(3) The coupling member is a member that is ring-shaped, and holds the overlapping portion of the flexible shielding member, the overlapping portion being sandwiched between the coupling member and the inner circumferential surface of the shielding pipe.

(4) The grommet is a non-conductive tubular elastic member, and includes, in an end region thereof, a portion that encloses a portion of the shielding pipe, and whose inner circumferential surface, when the grommet is in a natural state, has a diameter that is greater than a diameter of the outer circumferential surface of the portion contiguous with the expanded-diameter portion of the shielding pipe, and that is smaller than a diameter of the outer circumferential surface of the expanded-diameter portion.

An electromagnetic shielding component according to a second aspect is a variant of the electromagnetic shielding component according to the first aspect. In the electromagnetic shielding component according to the second aspect, an inner circumferential surface of the coupling member has a diameter that is greater than or equal to a diameter of the inner circumferential surface of the portion contiguous with the expanded-diameter portion of the shielding pipe.

An electromagnetic shielding component according to a third aspect is a variant of the electromagnetic shielding component according to the first aspect or the second aspect. In the electromagnetic shielding component according to the third aspect, the shielding pipe includes a metal pipe and an insulating coating formed on an outer circumferential surface of the metal pipe.

An electromagnetic shielding component according to a fourth aspect is a variant of the electromagnetic shielding component according to any one of the first to third aspects. In the electromagnetic shielding component according to the fourth aspect the grommet includes an intermediate portion that is a portion between two ends of the grommet, and that has a diameter that is greater than the diameter of the outer circumferential surface of the expanded-diameter portion when the grommet is in the natural state.

An electric wire assembly with electromagnetic shielding component according to a fifth aspect includes an electric wire and an electromagnetic shielding component according to any one of the above-described aspects. In this case, the electromagnetic shielding component that is cylindrical encloses the electric wire.

In each of the above-described aspects, an end portion of the shielding pipe, which contains metal material and is rigid, is formed as the expanded-diameter portion that has a diameter that is greater than the diameter of the portion that is contiguous with the expanded-diameter portion. The flexible shielding member is sandwiched between the inner surface of the expanded-diameter portion of the shielding pipe and the coupling member located inside the expanded-diameter portion.

Therefore, according to each of the above-described aspects, the flexible shielding member, which contains metal material and is strong, is interposed between the electric wire and the end portion of the shielding pipe, and prevents the electric wire from being damaged. Therefore, an edge cover for the shielding pipe is not required.

According to each of the above-described aspects, even if the gap between the inner circumferential surface of the portion other than the expanded-diameter portion of the shielding pipe and the outer circumferential surface of the electric wire is narrow, the expanded-diameter portion can be provided with a sufficiently wide gap into which the coupling member that holds the flexible shielding member can be inserted. Therefore, even if the density of the electric wire within the hollow space in the shielding pipe (rigid pipe) is increased, it is possible to couple the flexible shielding member to the shielding pipe without causing any problem.

According to each of the above-described aspects, in the step of passing the electric wire through the hollow space in the electromagnetic shielding component, it is unnecessary to pass the electric wire through the hollow space in the flexible shielding member from an end of the electric wire. Therefore, it is easy to pass the electric wire through the hollow space in the electromagnetic shielding component.

According to the second aspect, the inner circumferential surface of the coupling member inserted into the expanded-diameter portion of the shielding pipe does not protrude inward of an extension surface of the inner circumferential surface of the portion that is contiguous with the expanded-diameter portion of the shielding pipe. Therefore, it is possible to further increase the density of the electric wire within the hollow space in the shielding pipe (rigid pipe).

Also, the electric wire is unlikely to catch on the coupling member when the electric wire is passed through the hollow space in the shielding pipe.

According to the third aspect, the shielding pipe includes a metal pipe and an insulating coating formed on an outer circumferential surface of the metal pipe. The insulating coating prevents electric shock from occurring even when high voltage is generated across the metal pipe. The flexible shielding member is in contact with the inner circumferential surface of the metal pipe (the shielding pipe). Therefore, the insulating coating of the shielding pipe does not interfere with electrical connection between the metal pipe and the flexible shielding member.

According to each of the aspects above, the grommet is a member for preventing liquid from entering into the flexible shielding member, and a portion in an end region of the grommet is a closing portion that is positioned to cover the shielding pipe such that the closing portion comes into close contact with the outer circumferential surface of the expanded-diameter portion of the shielding pipe. The inner circumferential surface of the closing portion of the grommet has a diameter that is greater than the diameter of the outer circumferential surface of the portion contiguous with the expanded-diameter portion of the shielding pipe, and that is smaller than the diameter of the outer circumferential surface of the expanded-diameter portion.

When the electromagnetic shielding component including the grommet is to be attached to a supporting member such as the body of a vehicle, it is necessary to move the grommet along the outer circumferential surface of the shielding pipe. In order to slide the grommet having a large coefficient of friction along the outer circumferential surface of the shielding pipe while maintaining the closing portion in close contact with the outer circumferential surface of the shielding pipe, a large amount of force is required.

According to each of the aspects above, the closing portion of the grommet has a diameter that is greater than the diameter of the outer circumferential surface of the portion contiguous with the expanded-diameter portion of the shielding pipe. Therefore, it is possible to move the grommet with a very small amount of force during the process of moving the grommet along the outer circumferential surface of the shielding pipe, except when the closing portion of the grommet passes across the expanded-diameter portion of the shielding pipe. Therefore, it is easy to attach the electromagnetic shielding component that includes the grommet to a supporting member.

DESCRIPTION OF EMBODIMENTS

The following describes embodiments with reference to the accompanying drawings. The following embodiments are examples of embodiments of the present invention, and do not limit the technical scope of the present invention. The electric wire assembly with electromagnetic shielding component according to each embodiment is provided as a wire harness that is installed in a vehicle such as an automobile, for example.

First Embodiment

Figure 1:
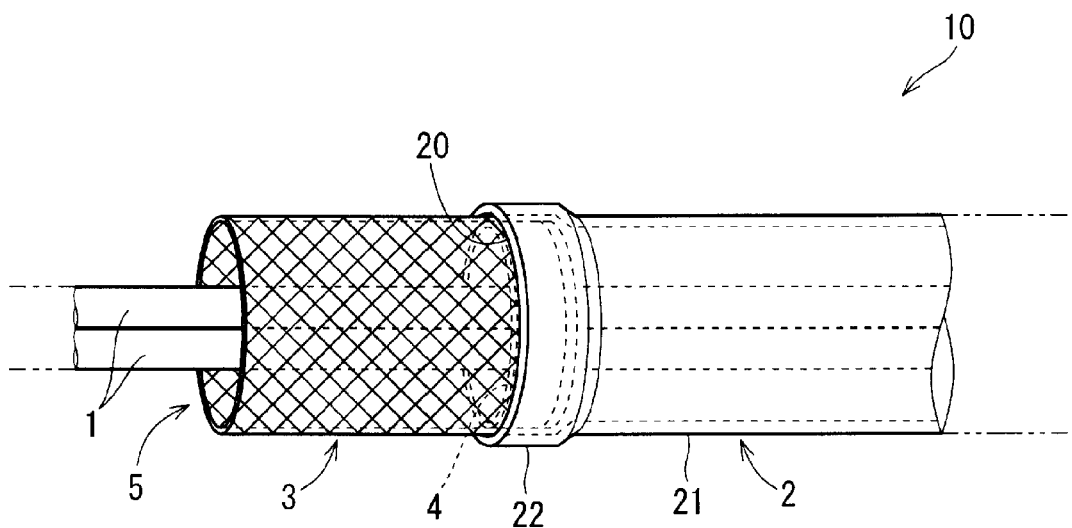
FIG. 1 is a perspective view of a main portion of an electric wire assembly 10 with electromagnetic shielding component according to a first embodiment.
Figure 2:
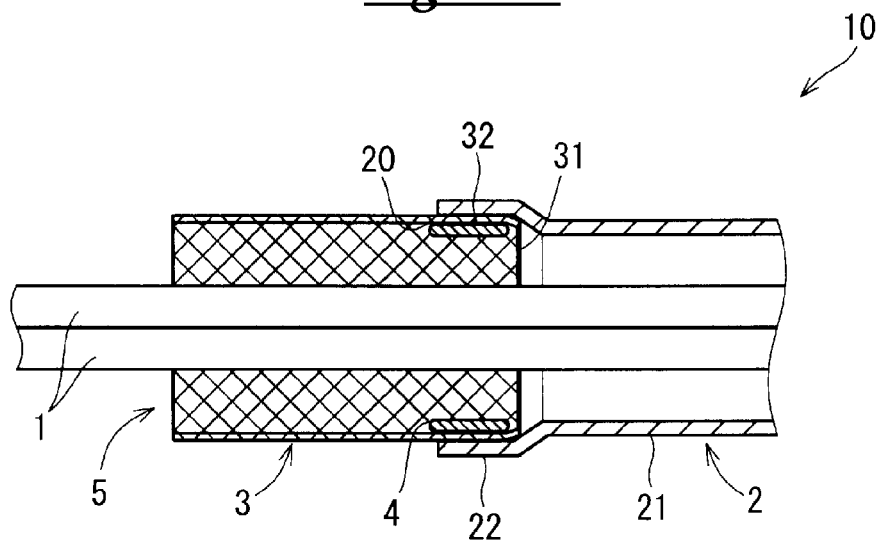
FIG. 2 is a vertical cross-sectional view of the main portion of the electric wire assembly 10 with electromagnetic shielding component.
Figure 6:
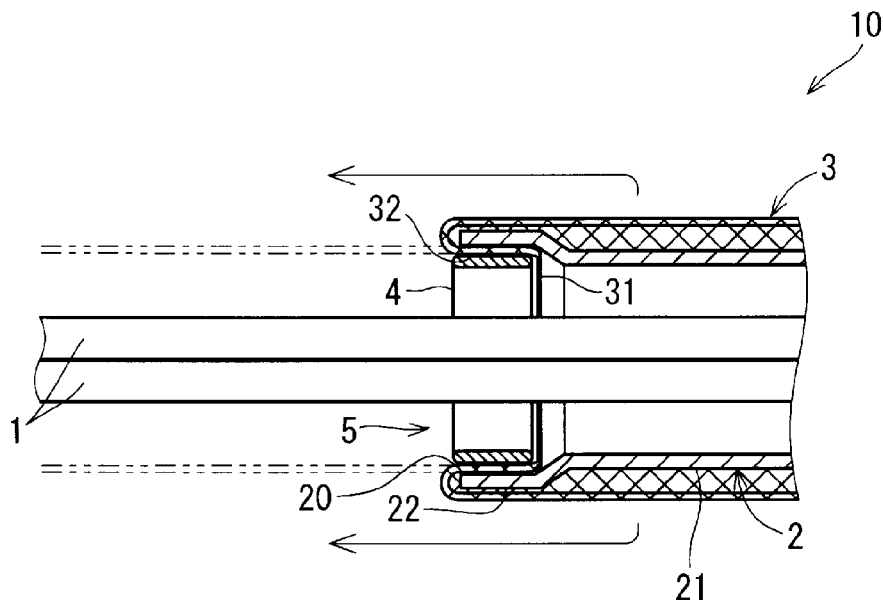
FIG. 6 is a vertical cross-sectional view of the main portion of the electric wire assembly 10 with electromagnetic shielding component when electric wires are covered by a flexible shielding member.
Figure 10:
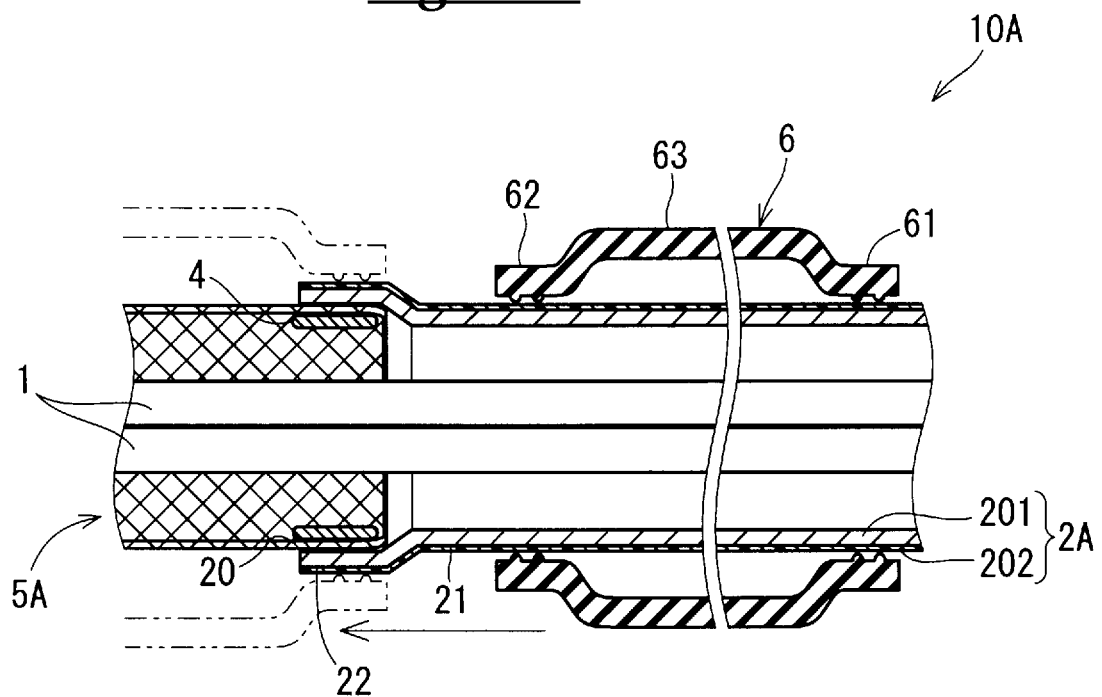
FIG. 10 is a vertical cross-sectional view of a main portion of an electric wire assembly 10A with electromagnetic shielding component according to a second embodiment.

First, a description is given of a configuration of an electric wire assembly 10 with electromagnetic shielding component according to a first embodiment with reference to FIGS. 1 and 2. As shown in FIG. 1, the electric wire assembly 10 with electromagnetic shielding component includes electric wires 1 and a tubular electromagnetic shielding component 5 that encloses the electric wires 1. Regarding the electric wires 1, note that the cross-sectional view in FIG. 2 shows side surfaces of the electric wires 1. Similarly, the cross-sectional views in FIGS. 6 and 10 show side surfaces of the electric wires 1.

The electric wires 1 are insulated electric wires each having a conductive core and an insulating coating with which the core is coated. In the example shown in FIG. 1, the electric wire assembly 10 with electromagnetic shielding component includes a plurality of electric wires 1, and the electromagnetic shielding component 5 encloses the plurality of electric wires 1.

The electromagnetic shielding component 5 includes a shielding pipe 2, a flexible shielding member 3, and a coupling member 4. The shielding pipe 2 and the flexible shielding member 3 are configured to provide a continuous hollow space that allows the electric wires 1 to pass through.

For the sake of convenience, FIGS. 1, 2, and so on show a situation in which the density of the electric wires 1 within the hollow space in the shielding pipe 2 is relatively small, i.e. a situation in which the gap between the inner circumferential surface of the shielding pipe 2 and the outer circumferential surface of the electric wires 1 is relatively wide. However, in each embodiment, the electric wires 1 may be housed within the hollow space in the shielding pipe 2 at a density higher than the density shown in the drawings.

Also note that the electric wires 1 may be a multi-core cable. A multi-core cable has a plurality of cores, and an insulating coating that insulates the plurality of cores from each other, with which the plurality of cores are coated altogether.

Next, a description is given of the electromagnetic shielding component 5 according to the first embodiment. In the electromagnetic shielding component 5, the shielding pipe 2 and the flexible shielding member 3 are coupled to each other by the coupling member 4, and the electromagnetic shielding component 5 thus has the shape of a continuous tube.

The shielding pipe 2 is a rigid tubular member that contains metal material. In the present embodiment, the shielding pipe 2 is a metal pipe that mainly contains metal such as aluminium or stainless steel.

Note that the shielding pipe 2 may be a member including a metal pipe integrated with a non-conductive material formed in a portion of the metal pipe. For example, the shielding pipe 2 may be a pipe including a metal pipe and insulating coatings formed on portions of the inner circumferential surface and the outer circumferential surface of the metal pipe.

The shielding pipe 2 has an expanded-diameter portion 22 that constitutes at least one end portion of the shielding pipe 2 and a base portion 21 that constitutes the remaining portion. The expanded-diameter portion 22 constitutes one end portion of the shielding pipe 2, and its inner circumferential surface and outer circumferential surface have a diameter that is greater than the diameter of the base portion 21 adjacent thereto. The expanded-diameter portion 22 provides a rim of an opening 20 at an end portion of the shielding pipe 2.

The expanded-diameter portion 22 constitutes one end portion of the shielding pipe 2, and its inner circumferential surface and outer circumferential surface have a diameter that is greater than the diameter of a portion that is contiguous therewith (the base portion 21). In other words, the diameter of the inner circumferential surface of the expanded-diameter portion 22 is greater than the diameter of the inner circumferential surface of the base portion 21, and the diameter of the outer circumferential surface of the expanded-diameter portion 22 is greater than the diameter of the outer circumferential surface of the base portion 21.

The shielding pipe 2 is a member obtained by processing one end portion of a pipe that has a uniform lateral cross section throughout the whole length, to expand the diameter of the end portion. One example method for performing this processing is described later.

The base portion 21 of the shielding pipe 2 includes a portion that is contiguous with the expanded-diameter portion 22. For example, the base portion 21 is a tube-shaped portion having a uniform lateral cross section. The base portion 21 is a straight or curving tube-shaped portion. In the example shown in FIG. 1, the base portion 21 is circular cylindrical. It is also conceivable that the base portion 21 is square pipe-shaped.

For example, the expanded-diameter portion 22 of the shielding pipe 2 is formed at both end portions of the shielding pipe 2.

The flexible shielding member 3 is a flexible cylindrical member that contains metal material. A typical example of the flexible shielding member 3 is a braided wire. A braided wire is a member having a structure in which conductive wires are woven into a tubular shape. The conductive wires constituting the braided wire each include: a wire rod that mainly contains copper; and plating that is formed on the surface of the wire rod, for example. Note that the conductive wires constituting the braided wire may each include a wire rod that mainly contains aluminum.

Note that the flexible shielding member 3 may be a member that includes a metal cloth rolled up into a tubular shape. The metal cloth is produced by weaving metal threads together. The metal cloth is, for example, fabric having a mesh structure in which metal threads mainly containing copper are woven such that the metal threads intersect each other in a lengthwise direction and a widthwise direction. In some cases, the metal cloth has a structure in which a flexible film made of resin material is pasted on a fabric made of metal threads. The metal cloth is conductive and flexible.

In the flexible shielding member 3, a portion in an end region extending from one end 31 constitutes an overlapping portion 32 that covers the inner circumferential surface of the expanded-diameter portion 22 of the shielding pipe 2. Thus, the flexible shielding member 3 is configured to provide a continuous hollow space together with the shielding pipe 2. The continuous hollow space provided in the shielding pipe 2 and the flexible shielding member 3 serves as a wiring route for the electric wires 1.

The coupling member 4 is a member for coupling the expanded-diameter portion 22 of the shielding pipe 2 and the overlapping portion 32 of the flexible shielding member 3 to each other, and is ring-shaped. The coupling member 4 holds the overlapping portion 32 of the flexible shielding member 3, with the overlapping portion 32 being sandwiched between the coupling member 4 and the inner circumferential surface of the expanded-diameter portion 22 of the shielding pipe 2. Examples of cases in which the coupling member 4 is ring-shaped include a case in which the outline of the inner circumferential surface of the coupling member 4 has the shape of an ellipse or a true circle, as well as a case in which the outline of the inner circumferential surface of the coupling member 4 has the shape of an elongated circle (a rectangle with rounded corners).

The coupling member 4 is, for example, a member that mainly contains iron and has a plated surface, or a member that mainly contains stainless steel.

The coupling member 4 according to the present embodiment is ring-shaped with a contour extending along the inner circumferential surface of the expanded-diameter portion 22 of the shielding pipe 2. The coupling member 4 holds the overlapping portion 32 of the flexible shielding member 3, with the overlapping portion 32 being sandwiched between the coupling member 4 and the inner circumferential surface of the expanded-diameter portion 22 of the shielding pipe 2. For example, the coupling member 4 pushes the overlapping portion 32 of the flexible shielding member 3 against the inner circumferential surface of the shielding pipe 2 along the whole length of the inner circumferential surface.

As shown in FIG. 2, the inner circumferential surface of the coupling member 4 may have a diameter that is greater than or equal to the inner circumferential surface of the base portion 21 that is contiguous with the expanded-diameter portion 22 of the shielding pipe 2. With such a configuration, the coupling member 4 does not project inward into the hollow space in the shielding pipe 2, i.e. the wiring route for the electric wires 1.

Figure 3:
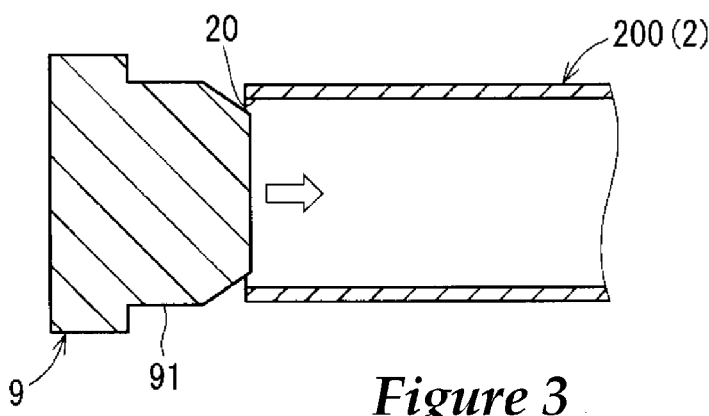
FIG. 3 is a first vertical cross-sectional view of an end portion of a shielding pipe (before pipe diameter expansion) in a case where the electromagnetic shielding component of the electric wire assembly 10 is manufactured by using a first method.
Figure 4:
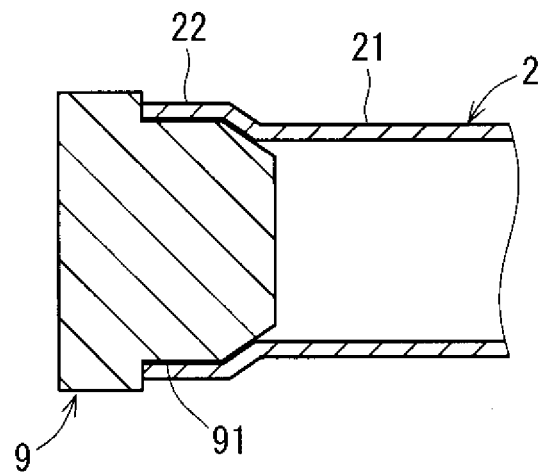
FIG. 4 is a second vertical cross-sectional view of the end portion of the shielding pipe (during pipe diameter expansion) in the case where the electromagnetic shielding component of the electric wire assembly 10 is manufactured by using the first method.
Figure 5:
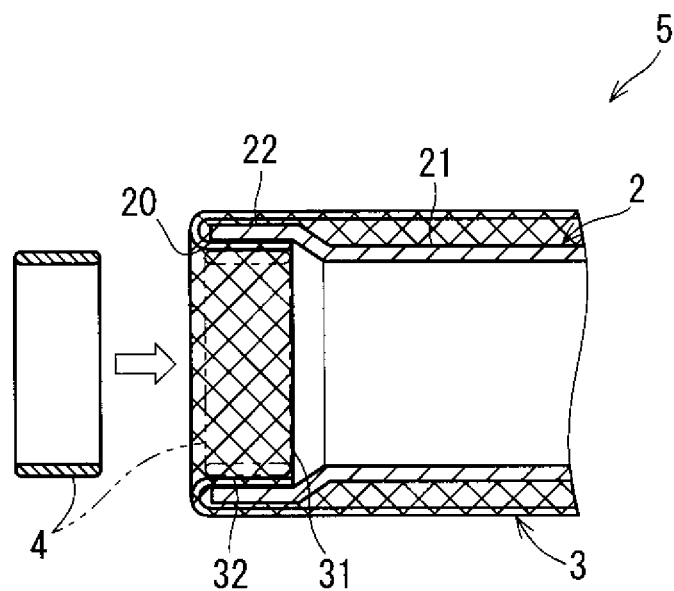
FIG. 5 is a vertical cross-sectional view of a main portion of the electromagnetic shielding component (before attachment of a coupling member) in the case where the electromagnetic shielding component of the electric wire assembly 10 is manufactured by using the first method.

Example of Procedure (First Method) for Manufacturing Electric Wire Assembly with Electromagnetic Shielding Component Next, a description is given of an example of a procedure (a first method) for manufacturing the electromagnetic shielding component 5 and the electric wire assembly 10 with electromagnetic shielding component with reference to FIGS. 3 to 5.

FIG. 3 is a first vertical cross-sectional view of an end portion of the shielding pipe 2 (before a pipe diameter expansion process) in a case where the electromagnetic shielding component 5 is manufactured by using the first method. FIG. 4 is a second vertical cross-sectional view of the end portion of the shielding pipe 2 (during the pipe diameter expansion process) in the case where the electromagnetic shielding component 5 is manufactured by using the first method. FIG. 5 is a vertical cross-sectional view of a main portion of the electromagnetic shielding component 5 (before the attachment of the coupling member 4) in the case where the electromagnetic shielding component 5 is manufactured by the first method.

The shielding pipe 2 is obtained by processing an end portion of an original pipe material 200 that has a uniform lateral cross section throughout the whole length, to expand the diameter of the end portion. This processing is hereinafter referred to as pipe diameter expansion.

As shown in FIGS. 3 and 4, pipe diameter expansion according to the first method is processing performed to expand an end portion of the original pipe material 200 from the inside by inserting a forming metal tool 9 having an expanded-diameter forming surface 91 into an opening 20 formed in an end of the original pipe material 200. The expanded-diameter forming surface 91 has a diameter that is greater than the diameter of the inner circumferential surface of the original pipe material 200.

The outer diameter of the expanded-diameter forming surface 91 of the forming metal tool 9 is, for example, slightly greater than or equal to the sum of the diameter of the inner circumferential surface of the original pipe material 200; and twice the sum of the thickness of the ring-shaped coupling member 4 and the thickness of the flexible shielding member 3.

The shielding pipe 2 having an end portion formed as the expanded-diameter portion 22 is obtained by applying the pipe diameter expansion to the original pipe material 200. The inner circumferential surface of the expanded-diameter portion 22 is formed into a shape that extends along the expanded-diameter forming surface 91 of the forming metal tool 9.

Furthermore, as shown in FIG. 5, a coupling member press-fitting step is performed, in which the coupling member 4 is inserted into the expanded-diameter portion 22 of the shielding pipe 2. This step is performed in a situation where the flexible shielding member 3 has been positioned to cover the outer circumferential surface of the original pipe material 200, and a portion of the flexible shielding member 3 extending from the end 31 has been folded to the inside of the expanded-diameter portion 22.

Note that the portion of the flexible shielding member 3 folded to the inside of the expanded-diameter portion 22 is the overlapping portion 32.

In a situation before the coupling member 4 is inserted into the expanded-diameter portion 22 of the shielding pipe 2, the outer diameter of the coupling member 4 is slightly greater than the value obtained by subtracting twice the thickness of the flexible shielding member 3 from the inner diameter of the expanded-diameter portion 22. The coupling member 4 is a ring-shaped metal member, for example, and it is unnecessary for the coupling member 4 to have a special structure for changing and maintaining its diameter.

In the coupling member press-fitting step, the coupling member 4 is pushed further inward of the flexible shielding member 3, relative to the expanded-diameter portion 22 of the shielding pipe 2 and the overlapping portion 32 of the flexible shielding member 3 located inward of the expanded-diameter portion 22. Consequently, the coupling member 4 is fitted to the inside of the overlapping portion 32 while slightly reducing the outer diameter thereof. As a result, the coupling member 4 holds the overlapping portion 32 of the flexible shielding member 3, with the overlapping portion 32 being sandwiched between the coupling member 4 and the inner circumferential surface of the expanded-diameter portion 22.

After the coupling member press-fitting step, the electric wires 1 are passed through the hollow space in the shielding pipe 2. For example, as shown in FIG. 6, the electric wires 1 are passed through the hollow space in the shielding pipe 2 with the flexible shielding member 3 covering the outer circumferential surface thereof. If this is the case, the portion of the flexible shielding member 3 covering the outer circumferential surface of the shielding pipe 2 is drawn out in the direction in which the expanded-diameter portion 22 of the shielding pipe 2 extends. Thus, the flexible shielding member 3 is unfolded.

By being drawn out as described above, the flexible shielding member 3 encloses a portion of the electric wires 1 that extends out of the opening 20 of the shielding pipe 2.

According to the above-described procedure, in the step of passing the electric wires 1 through the hollow space in the electromagnetic shielding component 5, it is unnecessary to pass the electric wires 1 through the hollow space in the flexible shielding member 3 from an end of the electric wires 1.

Note that procedures other than the procedure shown in FIG. 6 may be adopted. For example, the electric wires 1 may be passed through the hollow space in the shielding pipe 2 and the flexible shielding member 3, which has been coupled to the shielding pipe 2, after the flexible shielding member 3 is drawn out as described above.

Figure 7:
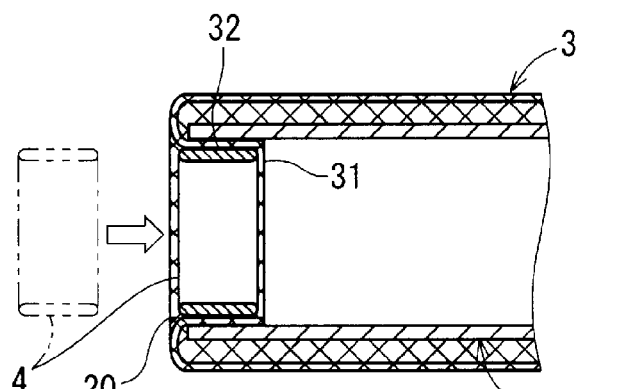
FIG. 7 is a first vertical cross-sectional view of the main portion of the electromagnetic shielding component (during attachment of the coupling member) in a case where the electromagnetic shielding component of the electric wire assembly 10 is manufactured by using a second method.
Figure 8:
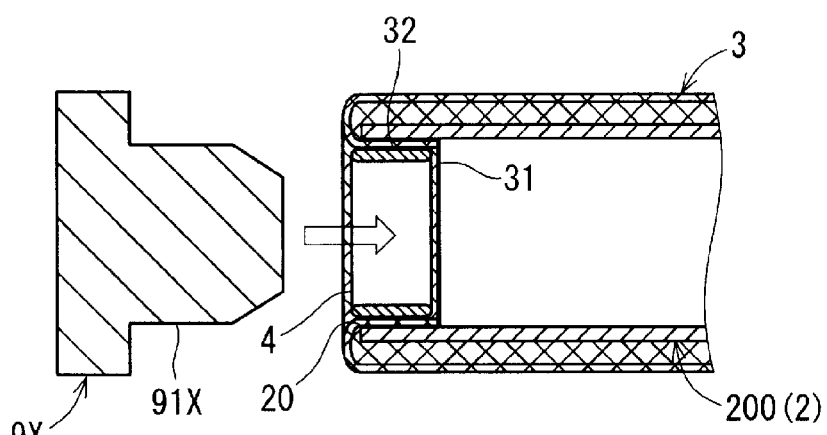
FIG. 8 is a second vertical cross-sectional view of the main portion of the electromagnetic shielding component (before pipe diameter expansion) in the case where the electromagnetic shielding component of the electric wire assembly 10 is manufactured by using the second method.
Figure 9:
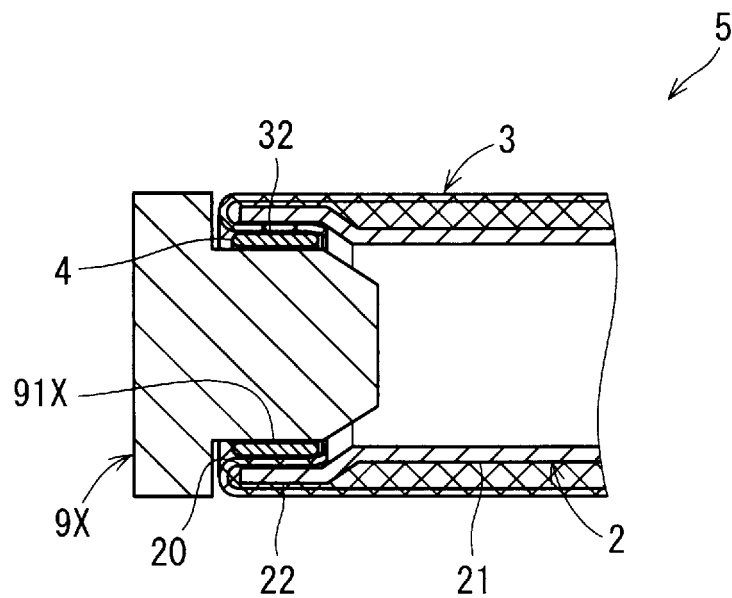
FIG. 9 is a second vertical cross-sectional view of the main portion of the electromagnetic shielding component (during pipe diameter expansion) in the case where the electromagnetic shielding component of the electric wire assembly 10 is manufactured by using the second method.

Example of Procedure (Second Method) for Manufacturing Electric Wire Assembly with Electromagnetic Shielding Component Next, a description is given of an example of a procedure (a second method) for manufacturing the electromagnetic shielding component 5 and the electric wire assembly 10 with electromagnetic shielding component with reference to FIGS. 7 to 9.

According to the second method, pipe diameter expansion is performed in a situation where the flexible shielding member 3 has been positioned to cover the outer circumferential surface of the original pipe material 200, a portion of the flexible shielding member 3 extending from the end 31 has been folded to the inner surface from the opening 20 of the original pipe material 200, and the coupling member 4 has also been positioned to cover the inner surface of the portion of the flexible shielding member 3.

As shown in FIGS. 8 and 9, pipe diameter expansion according to the second method is processing performed to expand the coupling member 4 and an end portion of the original pipe material 200 from the inside of the coupling member 4 by inserting a forming metal tool 9X having an expanded-diameter forming surface 91X into the opening 20 formed in an end of the original pipe material 200.

The outer diameter of the expanded-diameter forming surface 91X of the forming metal tool 9X is, for example, slightly greater than or equal to the diameter of the inner circumferential surface of the original pipe material 200.

The shielding pipe 2 having an end portion formed as the expanded-diameter portion 22, and the coupling member 4 having an expanded diameter, are simultaneously obtained by applying the pipe diameter expansion to the original pipe material 200. The coupling member 4 holds the overlapping portion 32 of the flexible shielding member 3, with the overlapping portion 32 being sandwiched between the coupling member 4 and the expanded-diameter portion 22.

A procedure performed after pipe diameter expansion according to the second method is the same as the procedure performed after the coupling member press-fitting processing according to the first method (see FIG. 6).

Second Embodiment

Next, a description is given of an electric wire assembly 10A with electromagnetic shielding component according to a second embodiment with reference to FIG. 10. FIG. 10 is a vertical cross-sectional view of a main portion of the electric wire assembly 10A with electromagnetic shielding component. In FIG. 10, constituent elements that are the same as the constituent elements shown in FIGS. 1 to 9 are given the same reference numerals.

The electric wire assembly 10A with electromagnetic shielding component is different from the electric wire assembly 10 with electromagnetic shielding component shown in FIGS. 1 and 2 in that a shielding pipe 2A with a resin coating is provided instead of the shielding pipe 2, and that a grommet 6 is added. The following describes differences of the electric wire assembly 10A with electromagnetic shielding component from the electric wire assembly 10 with electromagnetic shielding component.

Similar to the electric wire assembly 10 with electromagnetic shielding component, the electric wire assembly 10A with electromagnetic shielding component includes the electric wires 1 and an electromagnetic shielding component 5A that encloses the electric wires 1. The electromagnetic shielding component 5A includes the shielding pipe 2A, the flexible shielding member 3, and the coupling member 4.

The shielding pipe 2A is a pipe that includes a metal pipe 201 and an insulating coating 202 that is formed on the outer circumferential surface of the metal pipe 201. The metal pipe 201 mainly contains metal such as aluminium or stainless steel. The insulating coating 202 is a coating layer made of synthetic resin or rubber material, for example.

The shielding pipe 2A has the same structure as that of the shielding pipe 2 except that the insulating coating 202 is formed.

Furthermore, the electric wire assembly 10A with electromagnetic shielding component is also provided with a grommet 6 that is a non-conductive tubular elastic member. The grommet 6 may be a member that mainly contains rubber material such as rubber or elastomer.

The grommet 6 is a member for preventing liquid from entering into the flexible shielding member 3 when the electric wire assembly 10A with electromagnetic shielding component is attached to a supporting member such as the body of a vehicle. The grommet 6 includes a first closing portion 61, which is one end portion of the grommet 6, a second closing portion 62, which is the other end portion, and an intermediate portion 63 between them.

The first closing portion 61 is a portion that is positioned to cover the shielding pipe 2A such that the first closing portion 61 comes into close contact with the outer circumferential surface of the expanded-diameter portion 22 of the shielding pipe 2A. The second closing portion 62 is positioned to cover a rim (not shown in the drawing) formed around an opening that is formed in the supporting member, and that provides a path for the electric wires 1, for example. The rim is formed around an opening that is formed in a housing that houses a device to which the electric wires 1 are to be connected, for example.

When the grommet 6 is in a natural state, the inner circumferential surface of the first closing portion 61 has a diameter that is greater than the diameter of the outer circumferential surface of the base portion 21 (the portion contiguous with the expanded-diameter portion 22) of the shielding pipe 2A, and that is smaller than the diameter of the outer circumferential surface of the expanded-diameter portion 22. Note that a grommet in a natural state means a grommet to which external force is not being applied.

Also, in the example shown in FIG. 10, the inner circumferential surface of the intermediate portion 63 that is contiguous with the first closing portion 61 has a diameter that is greater than the diameter of the outer circumferential surface of the expanded-diameter portion 22 of the shielding pipe 2A. Also, in the example shown in FIG. 10, the whole inner circumferential surface of the grommet 6 has a diameter that is greater than the diameter of the outer circumferential surface of the base portion 21 of the shielding pipe 2A.

When the electromagnetic shielding component 5A is to be attached to a supporting member such as the body of a vehicle, it is necessary to move the grommet 6 along the outer circumferential surface of the shielding pipe 2A. During the process of moving the grommet 6 along the outer circumferential surface of the shielding pipe 2A, frictional resistance generated between the grommet 6 and the shielding pipe 2A remains very small, except when the first closing portion 61 passes across the expanded-diameter portion 22. Therefore, it is possible to move the grommet 6 along the shielding pipe 2A with a very small amount of force, except when the first closing portion 61 passes across the expanded-diameter portion 22.

In the example shown in FIG. 10, the grommet 6 is temporarily attached to the shielding pipe 2A such that the whole grommet 6 encloses the base portion 21 of the shielding pipe 2A, and then the grommet 6 is moved to a position at which the first closing portion 61 is in close contact with the outer circumferential surface of the expanded-diameter portion 22.

However, the grommet 6 may be temporarily attached to the shielding pipe 2A such that the first closing portion 61 encloses the base portion 21 and the intermediate portion 63 encloses the expanded-diameter portion 22.

In each of the electromagnetic shielding components 5 and 5A, an end portion of the shielding pipe 2 or 2A, which contains metal material and is rigid, is formed as the expanded-diameter portion 22 that has a diameter that is greater than the diameter of the base portion 21 that is contiguous with the expanded-diameter portion 22. The flexible shielding member 3 is sandwiched between the inner surface of the expanded-diameter portion 22 of the shielding pipe 2 or 2A and the coupling member 4 located inside the expanded-diameter portion 22.

If the electromagnetic shielding component 5 or 5A is adopted, the flexible shielding member 3, which contains metal material and is strong, is interposed between the electric wires 1 and the end portion of the shielding pipe 2 or 2A, and prevents the electric wires 1 from being damaged. Therefore, an edge cover is unnecessary for the shielding pipes 2 and 2A.

Also, if the electromagnetic shielding component 5 or 5A is adopted, even if the gap between the inner circumferential surface of the base portion 21 (the portion other than the expanded-diameter portion 22) of the shielding pipe 2 or 2A and the outer circumferential surface of the electric wires 1 is narrow, the expanded-diameter portion 22 can be provided with a sufficiently wide gap into which the coupling member 4 that holds the flexible shielding member 3 can be inserted. Therefore, even if the density of the electric wires 1 within the hollow space in the shielding pipe (rigid pipe) 2 or 2A is increased, it is possible to couple the flexible shielding member 3 to the shielding pipe 2 or 2A without causing any problem.

Here, note that the electric wires 1 are likely to catch on the flexible shielding member 3 when the electric wires 1 are passed through the hollow space in the flexible shielding member 3 such as a braided wire, from an end of the electric wires 1.

However, if the electromagnetic shielding component 5 or 5A is adopted, in the step of passing the electric wires 1 through the hollow space in the electromagnetic shielding component 5 or 5A, it is unnecessary to pass the electric wires 1 through the hollow space in the flexible shielding member 3 from an end of the electric wires 1, as shown in FIG. 6. Therefore, it is easy to pass the electric wires 1 through the hollow space in the electromagnetic shielding component 5 or 5A.

In each of the electromagnetic shielding components 5 and 5A, if the inner circumferential surface of the coupling member 4 has a diameter that is greater than or equal to the diameter of the inner circumferential surface of the base portion 21 of the shielding pipe 2 or 2A, the inner circumferential surface of the coupling member 4 inserted into the expanded-diameter portion 22 of the shielding pipe 2 or 2A does not protrude inward of an extension surface of the inner circumferential surface of the base portion 21 of the shielding pipe 2 or 2A. Therefore, it is possible to further increase the density of the electric wires 1 within the hollow space in the shielding pipe (rigid pipe) 2 or 2A. Also, the electric wires 1 are unlikely to catch on the coupling member 4 when the electric wires 1 are passed through the hollow space in the shielding pipe 2 or 2A.

If the shielding pipe 2A of the electromagnetic shielding component 5A is adopted, the insulating coating 202 prevents electric shock from occurring even when high voltage is generated across the metal pipe 201. The flexible shielding member 3 is in contact with the inner circumferential surface of the metal pipe 201 (the shielding pipe 2A). Therefore, the insulating coating 202 of the shielding pipe 2A does not interfere with electrical connection between the metal pipe 201 and the flexible shielding member 3.

If the electromagnetic shielding component 5 or 5A is adopted, the pipe processing step (the pipe diameter expansion step), in which the expanded-diameter portion 22 of the shielding pipe 2 or 2A is formed, also serves as the step of attaching the coupling member 4, as shown in FIGS. 8 and 9. Thus, it is possible to simplify the process of manufacturing the electromagnetic shielding component 5 or 5A. In addition, it is possible to hold the flexible shielding member 3 on the shielding pipe 2 or 2A, using the coupling member 4, which is very simple.

If the electromagnetic shielding component 5A is adopted, it is possible to move the grommet 6 with a very small amount of force during the process of moving the grommet 6 along the outer circumferential surface of the shielding pipe 2A. Therefore, it is easy to attach the electromagnetic shielding component 5A that includes the grommet 6 to a supporting member.

The shielding pipe 2A may be adopted in the electromagnetic shielding component 5. Also, the grommet 6 may be adopted in the electromagnetic shielding component 5.

The above-described embodiments and applications of the electromagnetic shielding component and the electric wire assembly with the electromagnetic shielding component according to the present invention can be freely combined within the scope of the invention recited in the claims, and the embodiments and the applications can also be configured by appropriately modifying the embodiments and the applications or omitting portions of the embodiments and the applications.

REFERENCE SIGNS LIST 10,10A Electric wire assembly with electromagnetic shielding component
1 Electric wire
2, 2A Shielding pipe
20 Opening in shielding pipe
200 Original pipe material
201 Metal pipe
202 Insulating coating
21 Base portion of shielding pipe
22 Expanded-diameter portion of shielding pipe
3 Flexible shielding member
31 End of flexible shielding member
32 Overlapping portion of flexible shielding member
4 Coupling member
5, 5A Electromagnetic shielding component
6 Grommet
61 First closing portion
62 Second closing portion
63 Intermediate portion
9, 9X Forming metal tool
91, 91X Expanded-diameter forming surface

The invention claimed is:

1. An electromagnetic shielding component comprising:
a shielding pipe that is tubular, contains metal material, is rigid, and includes an expanded-diameter portion that is an end portion whose inner circumferential surface and outer circumferential surface each have a diameter that is greater than diameters of an inner circumferential surface and an outer circumferential surface of a portion that is contiguous with the expanded-diameter portion;
a flexible shielding member that is tubular, contains metal material, is flexible, includes an overlapping portion that is a portion in an end region and that overlaps the inner circumferential surface of the expanded-diameter portion of the shielding pipe, and is configured to provide a continuous hollow space together with the shielding pipe;
a coupling member that is ring-shaped, and holds the overlapping portion of the flexible shielding member, the overlapping portion being sandwiched between the coupling member and the inner circumferential surface of the shielding pipe; and
a grommet that is a non-conductive tubular elastic member, and includes, in an end region thereof, a portion that encloses a portion of the shielding pipe, and whose inner circumferential surface, when the grommet is in a natural state, has a diameter that is greater than a diameter of the outer circumferential surface of the portion contiguous with the expanded-diameter portion of the shielding pipe, and that is smaller than a diameter of the outer circumferential surface of the expanded-diameter portion.

2. The electromagnetic shielding component according to claim 1,
wherein an inner circumferential surface of the coupling member has a diameter that is greater than or equal to a diameter of the inner circumferential surface of the portion contiguous with the expanded-diameter portion of the shielding pipe.

3. The electromagnetic shielding component according to claim 1,
wherein the shielding pipe includes a metal pipe and an insulating coating formed on an outer circumferential surface of the metal pipe.

4. The electromagnetic shielding component according to claim 1,
wherein the grommet includes an intermediate portion that is a portion between two ends of the grommet, and that has a diameter that is greater than the diameter of the outer circumferential surface of the expanded-diameter portion when the grommet is in the natural state.

5. An electric wire assembly with electromagnetic shielding component, comprising:
an electric wire; and
an electromagnetic shielding component that is tubular and encloses the electric wire,
wherein the electromagnetic shielding component includes:
a shielding pipe that is tubular, contains metal material, is rigid, and includes an expanded-diameter portion that is an end portion whose inner circumferential surface and outer circumferential surface each have a diameter that is greater than diameters of an inner circumferential surface and an outer circumferential surface of a portion that is contiguous with the expanded-diameter portion;
a flexible shielding member that is tubular, contains metal material, is flexible, includes an overlapping portion that is a portion in an end region and that overlaps the inner circumferential surface of the expanded-diameter portion of the shielding pipe, and is configured to provide a continuous hollow space for the electric wire to pass through, together with the shielding pipe;
a coupling member that is ring-shaped, and holds the overlapping portion of the flexible shielding member, the overlapping portion being sandwiched between the coupling member and the inner circumferential surface of the shielding pipe; and
a grommet that is a non-conductive tubular elastic member, and includes, in an end region thereof, a portion that encloses a portion of the shielding pipe, and whose inner circumferential surface, when the grommet is in a natural state, has a diameter that is greater than a diameter of the outer circumferential surface of the portion contiguous with the expanded-diameter portion of the shielding pipe, and that is smaller than a diameter of the outer circumferential surface of the expanded-diameter portion.

* * * * *